United States Patent
Lin et al.

(10) Patent No.: US 8,940,607 B2
(45) Date of Patent: Jan. 27, 2015

(54) MANUFACTURING METHOD OF TRENCH TYPE POWER TRANSISTOR DEVICE WITH SUPER JUNCTION

(71) Applicant: Anpec Electronics Corporation, Hsin-Chu (TW)

(72) Inventors: Yung-Fa Lin, Hsinchu (TW); Shou-Yi Hsu, Hsinchu County (TW); Meng-Wei Wu, Hsinchu (TW); Chia-Hao Chang, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/108,258

(22) Filed: Dec. 16, 2013

(65) Prior Publication Data

US 2014/0099762 A1    Apr. 10, 2014

Related U.S. Application Data

(62) Division of application No. 13/556,166, filed on Jul. 23, 2012.

(30) Foreign Application Priority Data

Dec. 16, 2011   (TW) .............................. 100146842 A

(51) Int. Cl.
| | |
|---|---|
| *H01L 21/336* | (2006.01) |
| *H01L 29/66* | (2006.01) |
| *H01L 29/78* | (2006.01) |
| *H01L 29/06* | (2006.01) |
| *H01L 21/265* | (2006.01) |
| *H01L 29/10* | (2006.01) |

(52) U.S. Cl.
CPC ...... *H01L 29/66734* (2013.01); *H01L 29/7813* (2013.01); *H01L 29/0634* (2013.01); *H10L 27/088* (2013.01); *H01L 21/26586* (2013.01); *H01L 29/0653* (2013.01); *H01L 29/1095* (2013.01)
USPC ........... 438/270; 438/259; 438/271; 438/589; 257/330

(58) Field of Classification Search
CPC .................................................... H01L 27/088
USPC .......................................................... 438/276
See application file for complete search history.

(56) References Cited

U.S. PATENT DOCUMENTS

| | | | | |
|---|---|---|---|---|
| 6,509,599 | B1 * | 1/2003 | Wurster et al. | ................ 257/301 |
| 2001/0029106 | A1 * | 10/2001 | Miller et al. | .................. 438/734 |

(Continued)

FOREIGN PATENT DOCUMENTS

| | | | |
|---|---|---|---|
| JP | 2010153622 A | * | 7/2010 |
| TW | 201010058 | | 3/2010 |
| TW | M409532 | | 8/2011 |

*Primary Examiner* — Ajay K Arora
(74) *Attorney, Agent, or Firm* — Winston Hsu; Scott Margo

(57) ABSTRACT

The present invention provides a manufacturing method of a trench type power transistor device with a super junction. First, a substrate of a first conductivity type is provided, and then an epitaxial layer of a second conductive type is formed on the substrate. Next, a through hole is formed in the epitaxial layer, and the through hole penetrates through the epitaxial layer. Two doped drain regions of the first conductivity type are then formed in the epitaxial layer respectively at two sides of the through hole, and the doped drain regions extend from a top surface of the epitaxial layer to be in contact with the substrate.

14 Claims, 8 Drawing Sheets

(56) References Cited

U.S. PATENT DOCUMENTS

| | | |
|---|---|---|
| 2008/0160702 A1 | 7/2008 | Nakazawa |
| 2010/0044791 A1 | 2/2010 | Hebert |
| 2011/0049614 A1 | 3/2011 | Gao |
| 2011/0053326 A1 | 3/2011 | Gao |
| 2013/0134487 A1* | 5/2013 | Lin et al. ............ 257/288 |

* cited by examiner

MANUFACTURING METHOD OF TRENCH TYPE POWER TRANSISTOR DEVICE WITH SUPER JUNCTION

CROSS REFERENCE TO RELATED APPLICATIONS

This application is a divisional application of and claims the benefit of U.S. patent application Ser. No. 13/556,166, filed Jul. 23, 2012.

BACKGROUND OF THE INVENTION

1. Field of the Invention

The present invention relates generally to a trench type power transistor device and a manufacturing method thereof, and more particularly, to a trench type power transistor device with super junction and a manufacturing method thereof.

2. Description of the Prior Art

In power transistor devices, the ON resistance (RDS (on)) between the drain and the source is proportional to the power consumption of the device, so an effective way to reduce the power consumption of the power transistor device is to lower the RDS (on). In power transistor devices, the resistance provided by the epitaxial layer used for withstanding high voltage is the main contribution to the RDS (on). However, another function of the epitaxial layer is to withstand the high voltage. Although increasing the doping concentration of the conductive material in the epitaxial layer can reduce the resistance, the breakdown voltage of the epitaxial layer will also be lowered, and the capacity of the power transistor device to withstand high voltages is degraded.

In order to maintain or increase the voltage withstanding ability of the power transistor device and lower the resistance of epitaxial layer, a power transistor device with a super junction with high voltage withstanding ability and low ON resistance has been developed in the industry. In conventional power transistor devices, P-type epitaxial layers and N-type epitaxial layers are formed alternatively on the substrate along a horizontal direction, so that the P-type epitaxial layers and N-type epitaxial layers may constitute a plurality of P-N junctions parallel to each other and perpendicular to the surface of the substrate. A conventional manufacturing method of the power transistor device uses an etching process to form a plurality of deep trenches in the N-type epitaxial layer, and a P-type epitaxial layer is then filled into each deep trench. However, the aspect ratio of the deep trench has a predetermined value, and the aspect ratio of the deep trench made by the etching process has its process limitation. Also, the P-type epitaxial layer can't completely fill up the deep trench, and voids are easily formed in the P-type epitaxial layer, so that the super junction has defects.

In view of this matter, the main objective of the industry in the current stage is to provide a novel trench type power transistor device and a manufacturing method thereof to prevent the formed super junction from having defects.

SUMMARY OF THE INVENTION

It is therefore a primary objective the present invention is to provide a trench type power transistor device with a super junction and a manufacturing method thereof, to avoid forming the super junction with defects.

According to a preferred embodiment, the present invention provides a manufacturing method of a trench type power transistor device with a super junction. First, a substrate of a first conductivity type is provided. An epitaxial layer of a second conductivity type different from the first conductivity type is then formed on the substrate. At least one through hole is formed in the epitaxial layer and extends the epitaxial layer. Two doped drain regions of the first conductivity type are then formed respectively in the epitaxial layer at both sides of the through hole, wherein the doped drain regions extend form the upper surface of the epitaxial layer to be in contact with the substrate. Next, an insulating layer is filled into the through hole, and the upper surface of the insulating layer is lower than the upper surface of the epitaxial layer. A doped channel region of the second conductivity type is then formed respectively in the epitaxial layer at each side of the through hole on the insulating layer, so as to transform each doped drain region at each side of the through hole on the insulating layer into each doped channel region. A gate structure is formed in the through hole on the insulating layer. A doped source region of the first conductivity type is then formed in the epitaxial layer respectively at each side of the through hole.

To achieve the aforementioned purpose, the present invention provides another manufacturing method of a trench type power transistor device with a super junction. First, a substrate of a first conductivity type is provided. A first epitaxial layer of a second conductivity type different from the first conductivity type is then formed on the substrate. Then, at least one through hole is formed in the first epitaxial layer and extends the first epitaxial layer. Afterwards, two doped drain region are formed in the first epitaxial layer respectively at both sides of the first through hole, wherein the doped drain regions extend from the upper surface of the first epitaxial layer to be in contact with the substrate. Next, a second epitaxial layer of a second conductivity type is formed on the first epitaxial layer and the insulating layer. Then, at least one through hole is formed in the second epitaxial layer to expose the insulating layer. Next, a gate structure is formed in the second through hole. Two doped source regions of the first conductivity type are then formed in the second epitaxial layer at both sides of the second through hole.

To achieve the aforementioned purpose, the present invention provides a trench type power transistor device with a super junction comprising a substrate of a first conductivity type, a first epitaxial layer of a second conductivity type different from the first conductivity type, at least two doped drain regions of the first conductivity type, an insulating layer, at least two doped channel regions of the second conductivity type, a gate structure and at least two doped source regions of the first conductivity type. The first epitaxial layer is disposed on the substrate and has at least one through hole. The doped drain region is disposed in the first epitaxial layer at both sides of the through hole to be in contact with the substrate. The insulating layer is disposed in the through hole and has an upper surface lower than the upper surface of the first epitaxial layer. The doped channel regions are disposed respectively in the first epitaxial layer on the doped drain regions, and respectively contact the doped drain regions. The gate structure is disposed in the through hole on the insulating layer. The doped source regions are disposed in the first epitaxial layer respectively at both sides of the through hole and respectively contact the doped channel regions.

To achieve the aforementioned purpose, the present invention provides another trench type power transistor device with a super junction comprising a substrate of a first conductivity type, a first epitaxial layer of a second conductivity type different from the first conductivity type, at least two doped drain regions of the first conductivity type, an insulating layer, a second epitaxial layer of the second conductivity type, a gate structure and at least two doped source regions of the first conductivity type. The first epitaxial layer is disposed on the substrate and has at least one first through hole. The doped drain regions are disposed in the first epitaxial layer at both sides of the first through hole and extend from the upper surface of the first epitaxial layer to be in contact with the substrate. The insulating layer fills up the first through hole. The second epitaxial layer is disposed on the first epitaxial layer and contacts the doped drain region, and the second epitaxial layer has at least one second through hole disposed on the insulating layer. The gate structure is disposed in the second through hole on the insulating layer. The doped source regions are disposed respectively in the second epitaxial layer at both sides of the second through hole.

The present invention uses a tilt-angle ion implantation process or a vapor phase doping process to form the doped drain regions in the epitaxial layer. In this manner, the super junction to be formed has better evenness, so as to prevent the defects of the super junction resulting from the gaps in the filled epitaxial layer in the condition that another epitaxial layer is filled directly into the through holes of the epitaxial layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
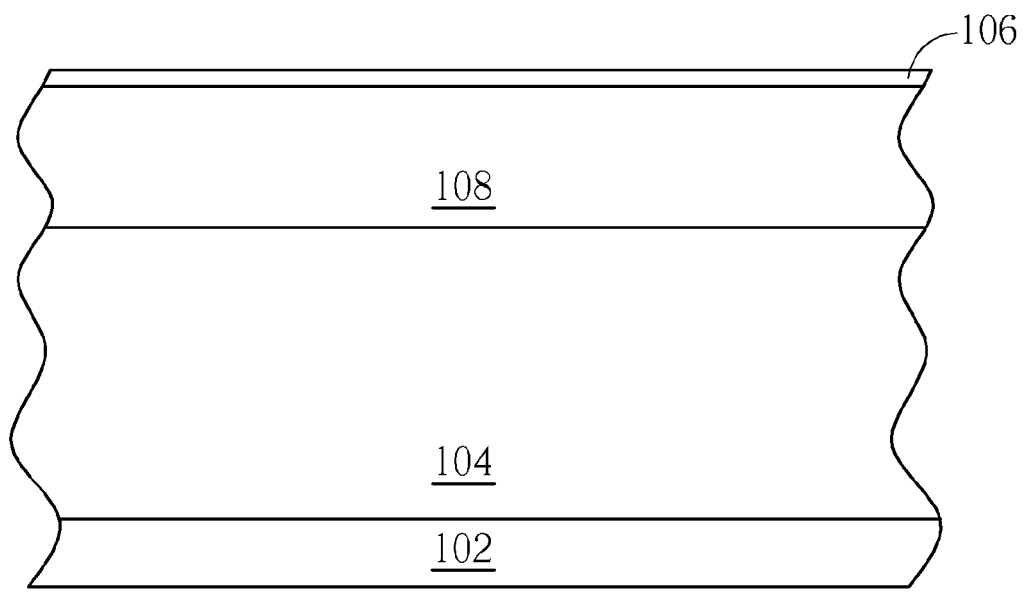
FIGS. 1-9 are schematic views illustrating a manufacturing method of a power transistor device with a super junction in accordance with a first embodiment of present invention.
Figure 7:
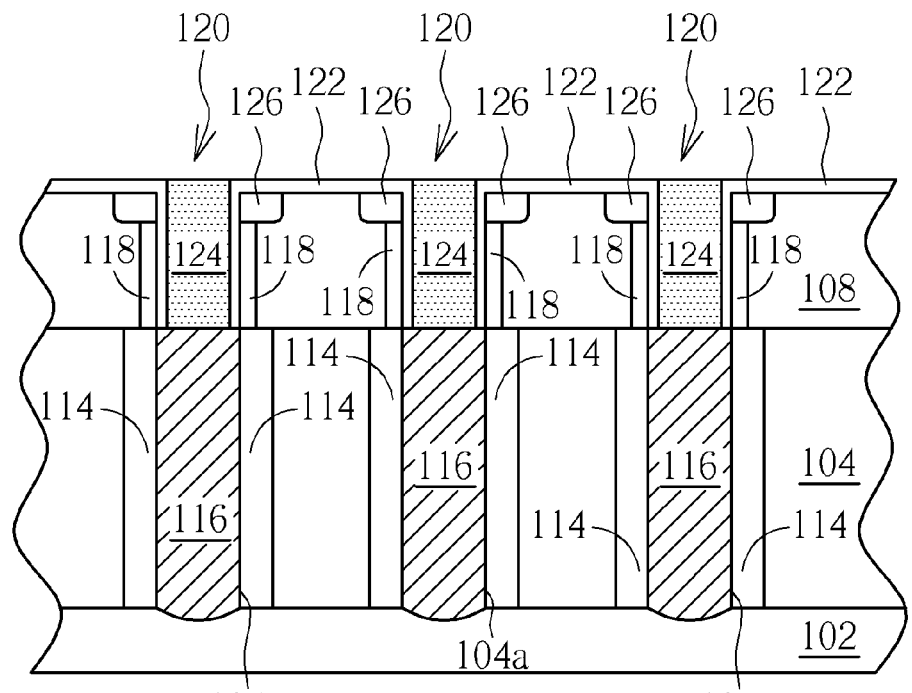
Figure 8:
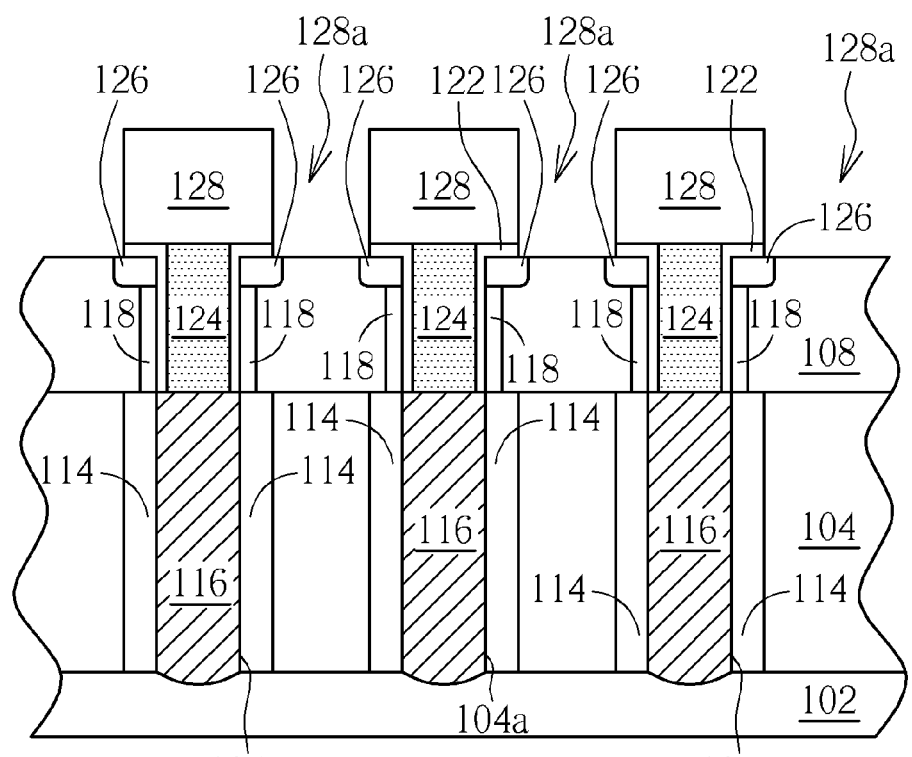
Figure 9:
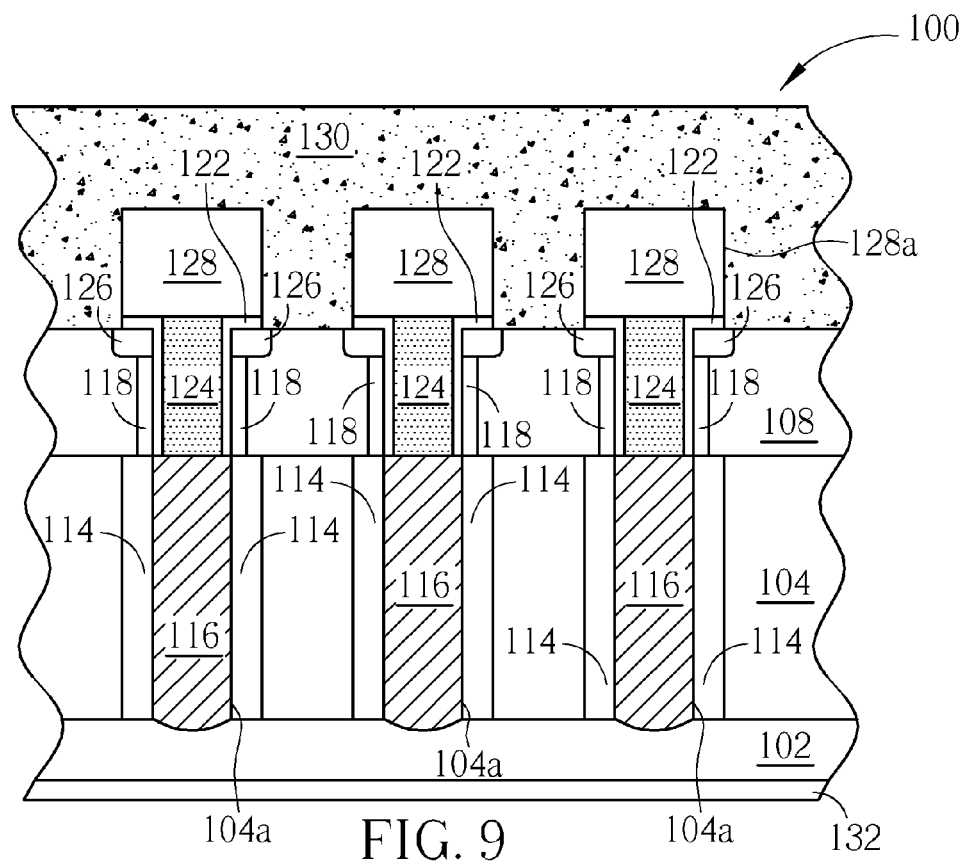

Please refer to FIGS. 1-9, which are schematic views illustrating a manufacturing method of a trench type power transistor device with a super junction in accordance with a first preferred embodiment of the present invention, wherein FIG. 9 is a cross-sectional view of the trench type power transistor device with the super junction in accordance with the first preferred embodiment of the present invention. First, as shown in FIG. 1, a substrate 102, such as a silicon substrate, of a first conductivity type is provided. Then, an epitaxial process, ex. a physical vapor deposition process (PVD) or a chemical vapor deposition process (CVD), is performed to form an epitaxial layer 104 of a second conductivity type different from the first conductivity type on the substrate 102. Next, a pad layer 106 is formed on the epitaxial layer 104, and an ion implantation process of a second conductivity type and a thermal drive-in process are then performed to form a well region 108 of the second conductivity type in the epitaxial layer 104. Moreover, the first conductivity type and second conductivity type of present invention are respectively N-type and P-type, but the present invention is not limited thereto. The two conductivity types may be interchanged. In other embodiment of the present invention, the liner layer 106 may optionally not be formed on the epitaxial layer 104, and the well region 108 may optionally not be formed in the epitaxial layer 104.

Figure 2:
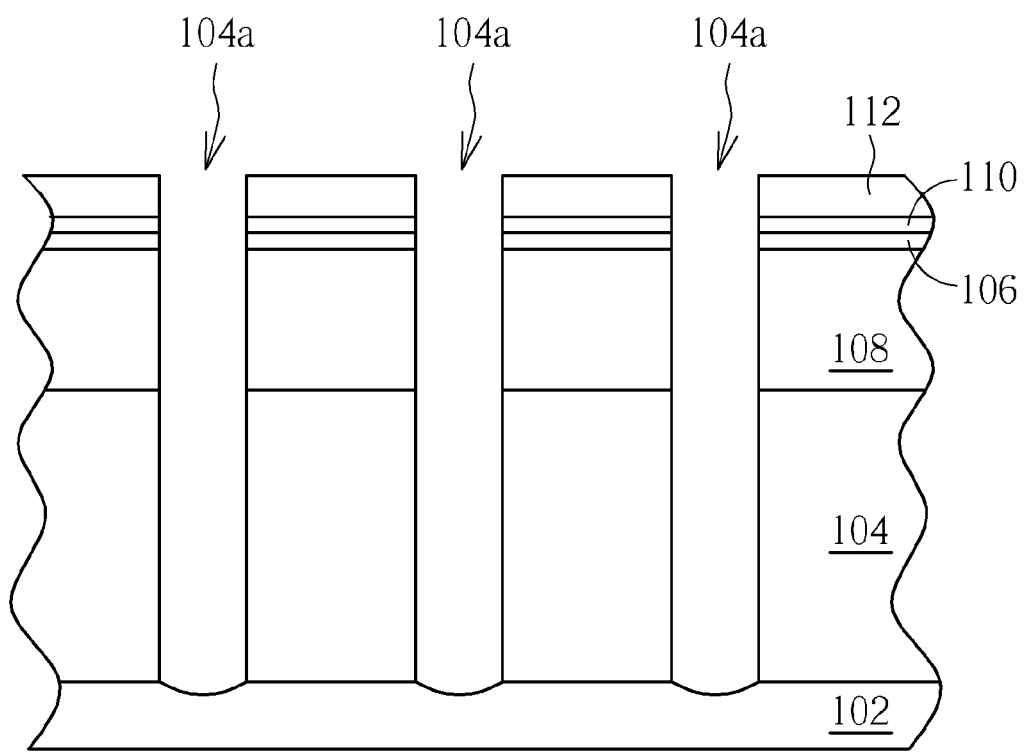

As shown in FIG. 2, a deposition process is carried out to form a first hard mask layer 110, ex. a silicon nitride layer, on the liner layer 106. Another deposition process is then performed to form a second hard mask layer 112, ex. a silicon oxide layer, on the first hard mask layer 110. Next, the second hard mask layer 112, the first hard mask layer 110 and the liner layer 106 are patterned to form an opening, so as to expose the P-type epitaxial layer 104. Then, an etching process using the second hard mask layer 112 as a mask is performed to form a plurality of through holes 104a in the P-type epitaxial layer 104. The through holes 104a penetrate through the P-type epitaxial layer 104 and expose the N-type substrate 102. Each through hole 104a may further extend into the N-type substrate 102, but not limited thereto. Besides, the number of the through hole in present invention is not limited to be a plurality. There may be a single through hole only.

Figure 3:
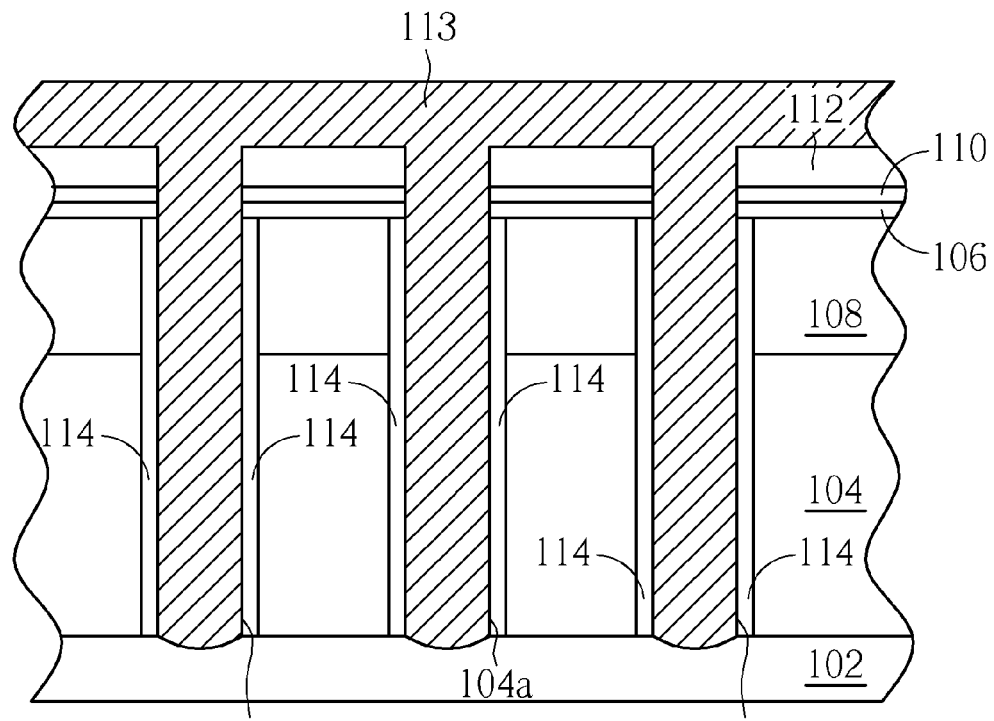

Next, as shown in FIG. 3, a plurality of N-type ions are implanted into the P-type epitaxial layer 104 and the P-type well region 108 at two sides of each through hole 104a. In this embodiment, the step of implanting the N-type ions into the P-type epitaxial layer 104 and P-type well region 108 may be performed by utilizing an N-type tilt-angle ion implantation process or an N-type vapor phase doping process, but not limited thereto. A thermal drive-in process is then performed to form two N-type doped drain regions 114 respectively in the P-type epitaxial layer 104 and the P-type well region 108 at two sides of each through hole 104a, wherein each N-type doped drain region 114 extends from the upper surface of the P-type epitaxial layer 104 to be in contact with the N-type substrate 102. In this manner, the N-type doped drain region 114 and the P-type epitaxial layer 104 may constitute a P-N junction, which is also called the super junction, extending from the P-type epitaxial layer 104 to the N-type substrate 102 and being substantially perpendicular to the N-type substrate 102. Afterwards, another deposition process is performed to form an insulating material layer 113, ex. a silicon oxide layer, on the second hard mask layer 112. The insulating material layer 113 fills up each through hole 104a. It is worth noted that the main point of this embodiment is to use the tilt-angle ion implantation process or the vapor phase doping process to implant N-type ions into the P-type epitaxial layer 104, and then a thermal drive-in process is utilized to diffuse the N-type ions to form the N-type doped drain region 114. In this manner, the formed super junction has a better evenness, so as to prevent the defects of the super junction resulting from the voids in the N-type epitaxial layer that are formed by directly filling the N-type epitaxial layer into the through hole. It is worth noted that the main point of the manufacturing method of this embodiment is to implant the N-type ions into the P-type epitaxial layer 104 through the tilt-angle ion implantation process or the vapor phase doping process and then diffuse the N-type ions through the thermal drive-in process to form the N-type doped drain region 114, so that the formed super junction could have a better evenness, and the super junction having defects resulted from the voids in the N-type epitaxial layer generated by directly filling the N-type epitaxial layer into the through hole could be avoided.

Figure 4:
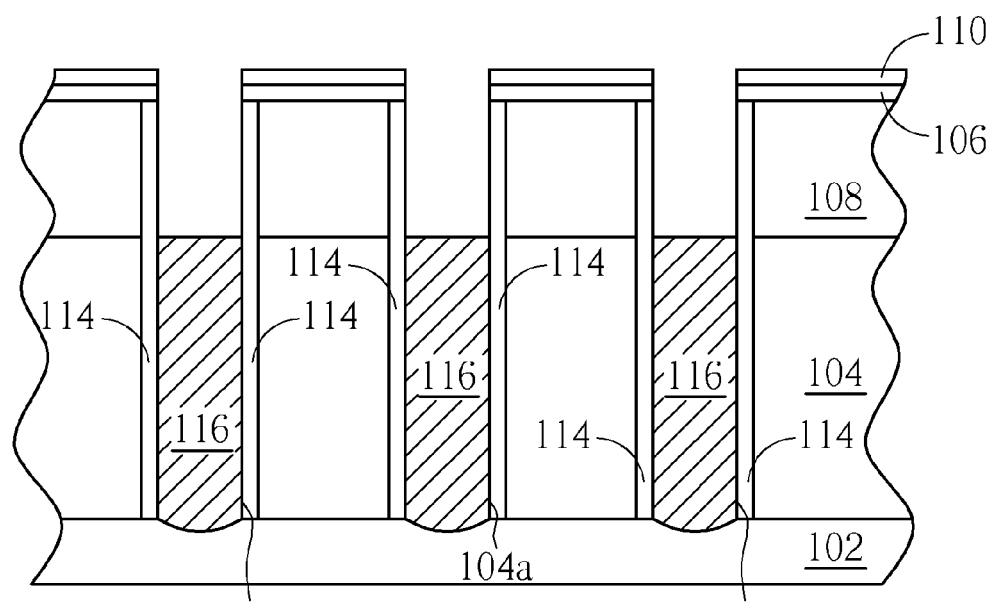

Then, as shown in FIG. 4, the insulating material layer 113 outside each through hole 104a and the second hard mask layer 112 are removed. Since the insulating material layer 113 and the second hard mask layer 112 in this embodiment are made of the same material, the step of removing the insulating material layer 113 outside each through hole 104a and the second hard mask layer 112 may utilize a polishing process, but not limited thereto. Next, another etching process is performed to remove apart of the insulating material layer 113 in each through hole 104a, so as to form an insulating layer 116 whose upper surface is lower than the upper surface of the P-type epitaxial layer 104. Moreover, the bottom of P-type well region 108 is substantially leveled with the upper surface of the insulating layer 116, but not limited thereto.

Figure 5:
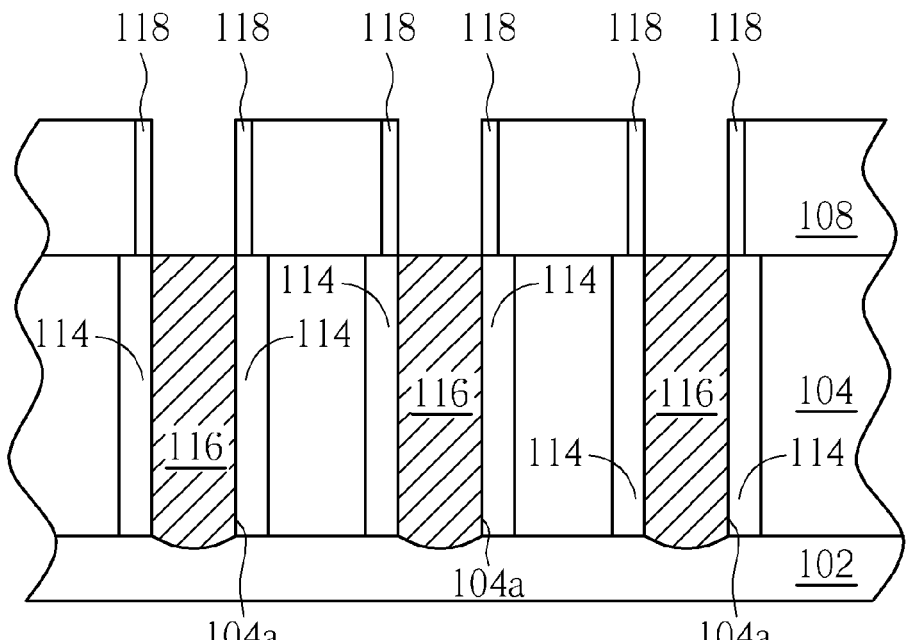

Next, as shown in FIG. 5, a plurality of P-type ions are implanted into the P-type well region 108 at each side of each through hole 104a on the insulating layer 116. In this embodiment, the step of implanting the P-type ions into the P-type well region 108 may be a P-type tilt-angle ion implantation process or a P-type vapor phase doping process, but not limited thereto. A thermal drive-in process is then performed to form a P-type doped channel region 118 in the P-type well region 108 at each side of each through hole 104a on the insulating layer 116. This P-type doped channel region 118 may be formed by transforming each N-type doped drain region 114 of each through hole 104a on the insulating layer 116 via the aforementioned P-type doping, so that each P-type doped channel region 118 contacts each underlying N-type doped drain region 114. The first hard mask layer 110 and the liner layer 106 are then removed to expose the upper surface of the P-type epitaxial layer 104. The P-type doped channel region 118 of this embodiment may serve as the channel of a trench type power transistor device 100. In other embodiment of present invention, it is unnecessary to perform the thermal drive-in process between the step of implanting N-type ions and the step of forming insulating layer, and the N-type doped drain region 114 and the P-type doped channel region may be formed by the same thermal drive-in process.

Figure 6:
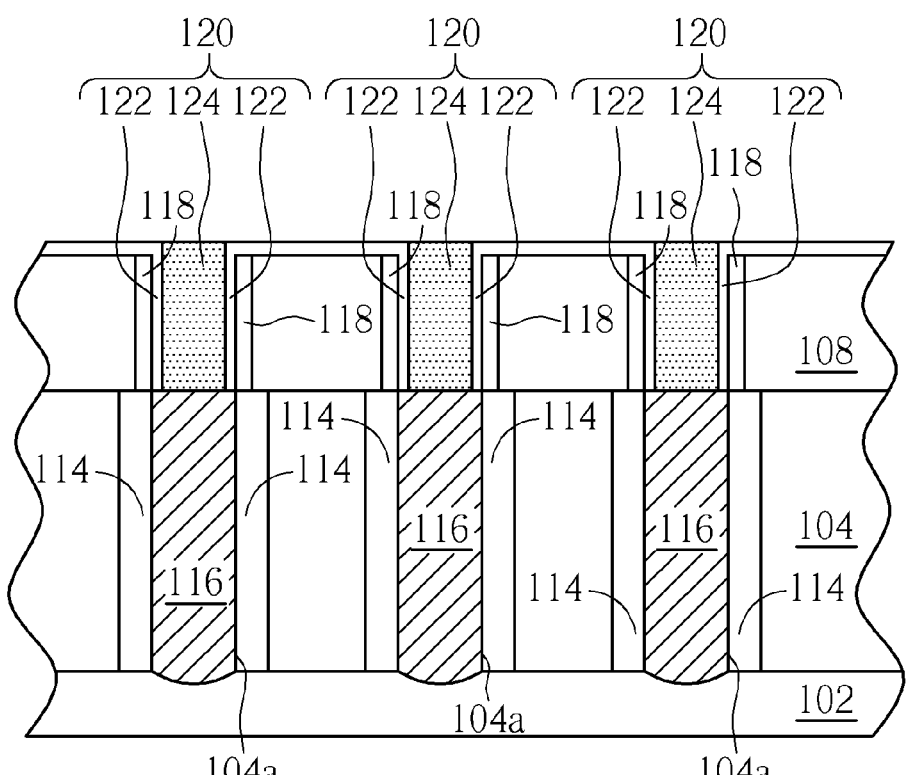

Next, as shown in FIG. 6, agate structure 120 is formed in each through hole 104a on the insulating layer 116. Moreover, the gate structure 120 includes agate insulator layer 122 and a gate conductive layer 124, wherein the gate insulator layer 122 is disposed between the gate conductive layer 124 and the P-type well region 108. In this embodiment, the step of forming the gate structure 120 may include performing a thermal oxidation process first to form a gate insulator layer 122 on the upper surface of each P-type well region 108 and on the sidewall of each through hole 104a on the insulating layer 116, and then performing another deposition process to form a gate conductive layer 124, ex. a polycrystalline silicon layer, on the gate insulator layer 122, wherein the gate conductive layer 124 fills up each through hole 104a on the insulating layer 116. A polishing process and an etching back process are then performed to remove the gate conductive layer 124 outside each through hole 104a, so as to form the gate structure 120 in each through hole 104a. The gate conductive layer 124 in this embodiment may serve as the gate of a trench type power transistor device.

Then, as shown in FIG. 7, a photolithographic process and an N-type ion implantation process are performed to form an N-type doped region on the P-type doped channel region 118 around the gate conductive layer 124. A thermal drive-in process is then performed to form an N-type doped source region 126 on each P-type doped channel region 118. Each N-type doped source region 126 contacts each P-type doped channel region 118 and serves as the source of a trench type power transistor device.

Next, as shown in FIG. 8, a dielectric layer 128 is covered on the gate insulator layer 122 and gate conductive layer 124. A photolithographic process and an etching process are then performed to form a plurality of contact holes 128a in the dielectric layer 128 and gate insulator layer 122, so as to expose the P-type epitaxial layer 104 and the N-type doped source region 126. In other embodiment of present invention, another P-type ion implantation process and thermal drive-in process may be performed after the forming of contact holes to form a P-type doped contact region in the P-type epitaxial layer exposed by each contact hole, in order to lower the contact resistance, wherein the P-type doped contact region contacts the N-type doped source region and P-type well region.

Afterwards, as shown in FIG. 9, a source metal layer 130 is formed on the dielectric layer 128 and into each contact hole 128a. Furthermore, a drain metal layer 132 is formed under the N-type substrate 102. In this embodiment, the step of forming the source metal layer 130 and drain metal layer 132 may include a plasma sputtering process or an electron beam deposition process, and the source metal layer 130 may include metal such as Ti, TiN, Al, W or metal compounds, but not limited thereto. At this stage, the trench type power transistor device 100 of this embodiment is completed. In other embodiments of present invention, a contact plug may be formed in each contact hole before the forming of the source metal layer, or a barrier layer may be formed on the P-type well region at the bottom of each contact hole.

The trench type power transistor device and the manufacturing method thereof of present invention are not limited to the aforementioned embodiments. Alternative embodiments and modifications of present invention will be further disclosed hereafter. In order to simplify the description and highlight the differences between the various embodiments or the modifications, similar reference numbers will be used to describe same components, and similar description will not be repeated again in the following paragraph.

Figure 10:
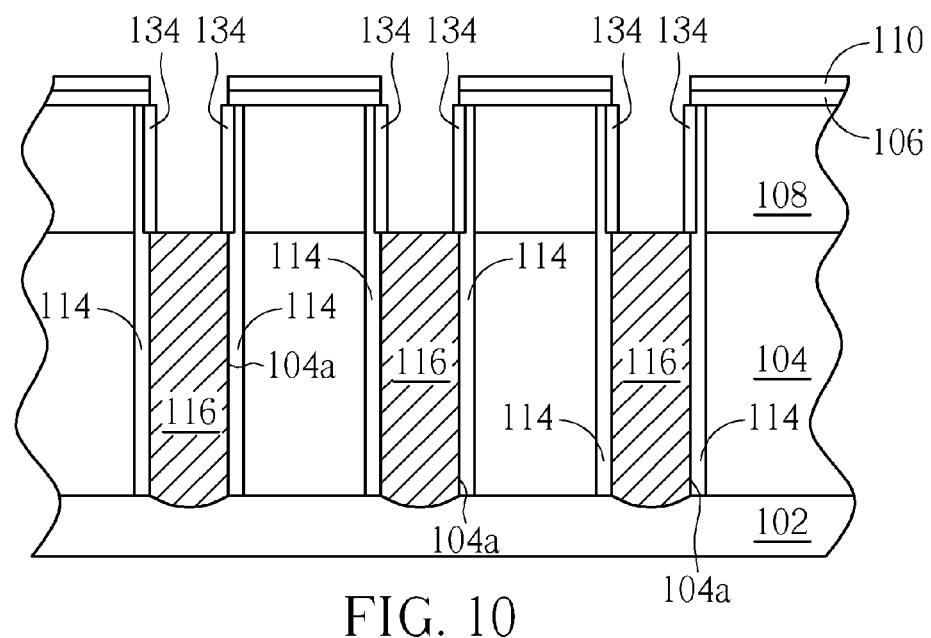
FIGS. 10-11 are schematic views illustrating a manufacturing method of a power transistor device with a super junction in accordance with a second embodiment of present invention.
Figure 11:
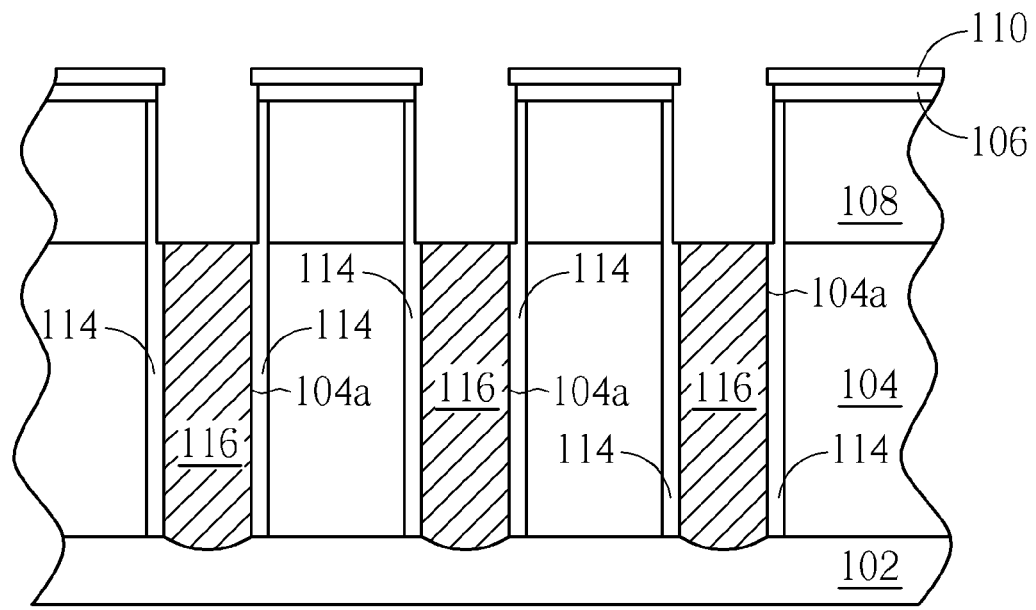

Please refer to FIGS. 10 and 11, and also refer to FIGS. 1-4 and 5-9. FIGS. 10 and 11 illustrate a manufacturing method of a trench type power transistor with a super junction in accordance with a second preferred embodiment of the present invention. To facilitate the description, similar reference numbers in the first embodiment will be used to denote same components in this embodiment. The steps of the manufacturing method before forming the insulating layer in this embodiment are identical to those of the first embodiment, as shown in FIGS. 1-4, and redundant detailed description is herein omitted. In comparison to the first embodiment, the manufacturing method of this embodiment further performs a thermal oxidation process after the step of forming the insulating layer to form two oxide layers 134 respectively on two sidewalls of each through hole 104a on the insulating layer 116. The exposed silicon material of each N-type doped drain region 114 will react with oxygen in the thermal oxidation process, so that a part of each N-type doped drain region 114 close to each through hole 104a will be transformed into a part of each oxide layer 134. As shown in FIG. 11, a wet etching process is then performed to remove the oxide layer 134. It is worth noting that, since the N-type doped drain region 114 is formed by an N-type ion implantation process and a thermal drive-in process, the N-type doped drain region 114 close to the sidewall of each through hole 104a has a higher doping concentration than the N-type doped drain region 114 far away the sidewall of each through hole 104a. This embodiment uses the thermal oxidation process to transform the N-type doped drain region 114 with higher doping concentration into the oxide layer 134, and then uses the etching process to remove the oxide layer 134, i.e. to remove the N-type doped drain region 114 with higher doping concentration. By removing the N-type doped drain region 114 with higher doping concentration, it is unnecessary to increase the implanting concentration of the P-type ions for neutralizing the N-type doped drain region with higher concentration, so as to further effectively control the doping concentration of the P-type doped channel region 118. As shown in FIGS. 5-9, since the steps of the manufacturing method after the formation of the P-type doped channel region 118 in this embodiment is identical to those of the first embodiment, and the power transistor devices to be formed in the first embodiment and in this embodiment are also the same, thus redundant detailed description is herein omitted.

Figure 12:
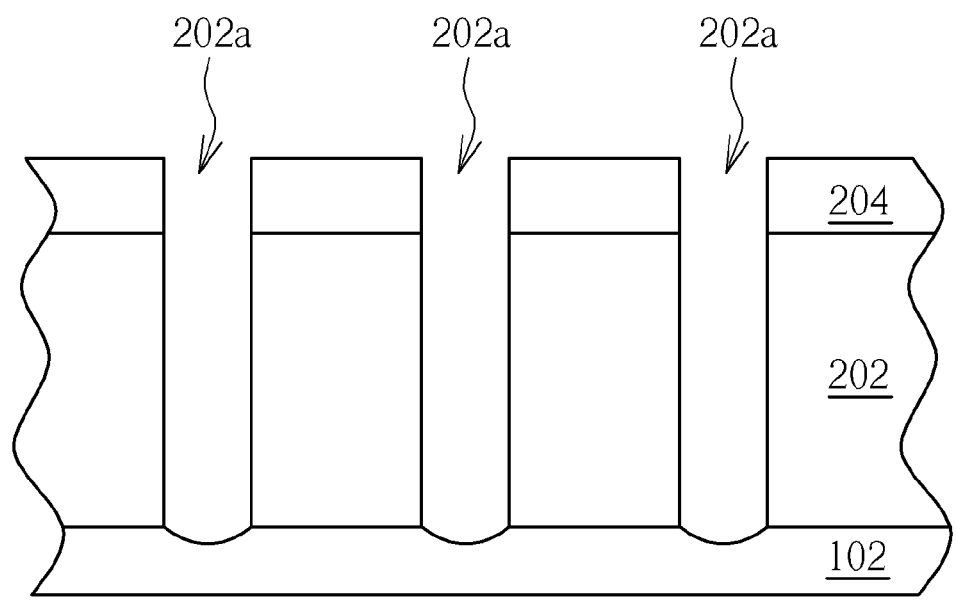
FIGS. 12-15 are schematic views illustrating the manufacturing method of a power transistor device with a super junction in accordance with the third embodiment of present invention.
Figure 13:
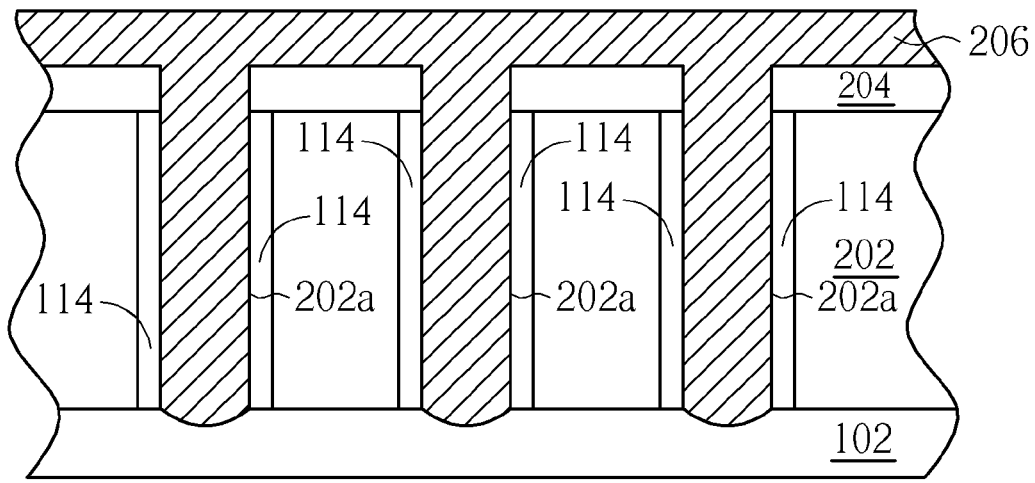
Figure 14:
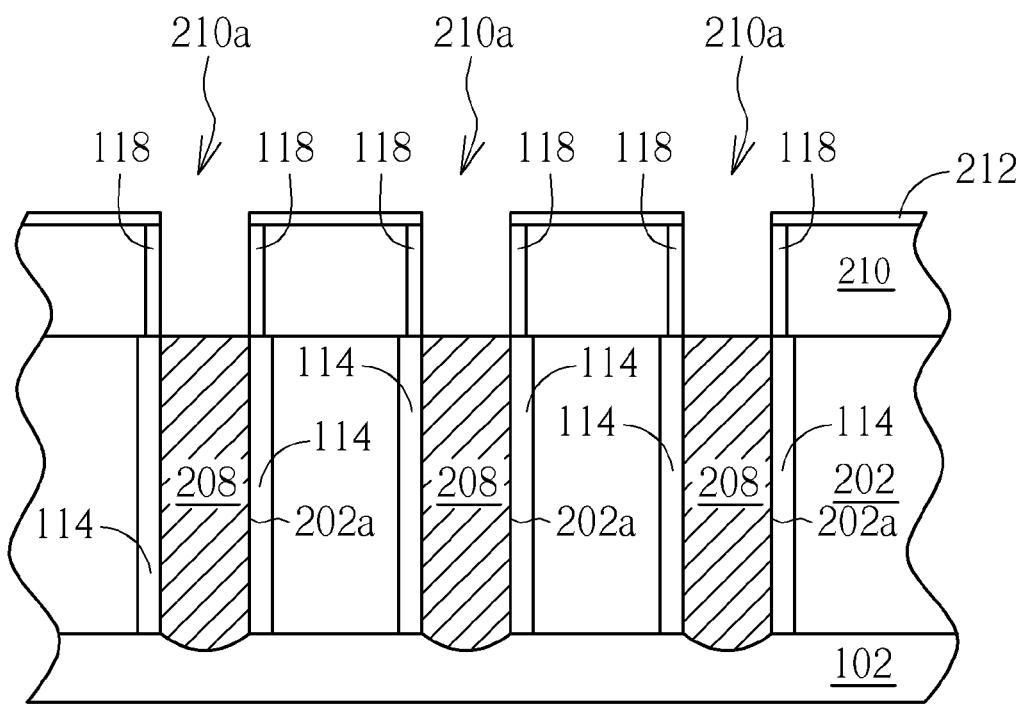
Figure 15:
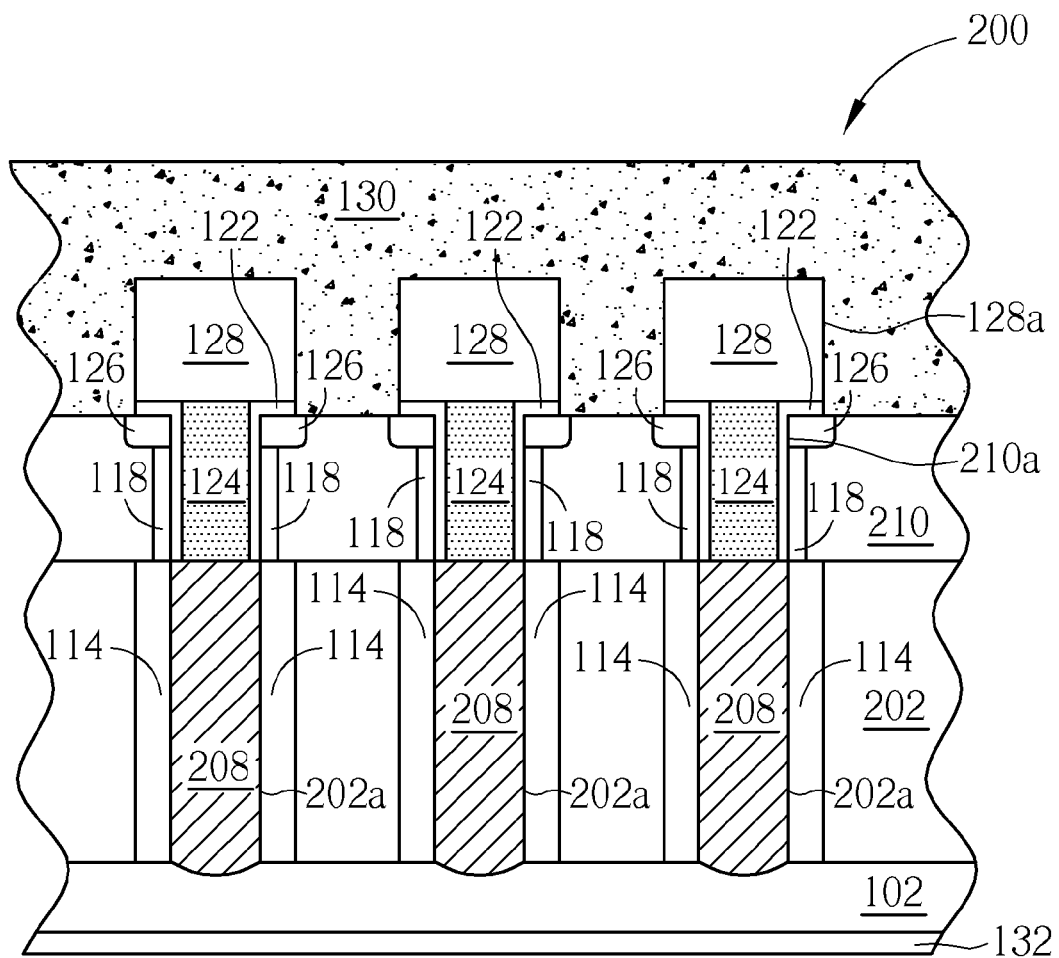

Please refer to FIGS. 12-15, which are schematic views illustrating the manufacturing method of a trench type power transistor device with a super junction in accordance with a third embodiment of the present invention, wherein FIG. 15 is a cross-sectional view of a trench type power transistor device with a super junction in accordance with a third preferred embodiment of the present invention. In comparison to the first embodiment, as shown in FIG. 12, as compared with the first embodiment, the manufacturing method of this embodiment is to form a P-type first epitaxial layer 202 on an N-type substrate 102 after providing the N-type substrate 102 and forming a first hard mask layer 204 on the P-type first epitaxial layer 202. The first hard mask layer 204 is then patterned to expose the P-type first epitaxial layer 202. The P-type first epitaxial layer 202 is then etched by using the first hard mask layer 204 as a mask to form a plurality of first through holes 202a penetrating through the P-type first epitaxial layer 202 in the P-type first epitaxial layer 202.

Next, as shown in FIG. 13, a plurality of N-type ions are implanted into the P-type first epitaxial layer 202 at two sides of each first through hole 202a. In this embodiment, the process of implanting N-type ions in the P-type first epitaxial layer 202 may utilize an N-type tilt-angle ion implantation process or an N-type vapor phase doping process, but not limited thereto. A thermal drive-in process is then performed to form two N-type doped drain regions 114 in the P-type first epitaxial layer 202 respectively at two sides of each through hole 202a, wherein the N-type doped drain regions extend from the top surface of the P-type first epitaxial layer 202 to be in contact with the N-type substrate 102. In this manner, the N-type doped drain region 114 and the P-type first epitaxial layer 202 may constitute a P-N junction, i.e. a super junction, extending from the P-type first epitaxial layer 202 to the N-type substrate 102 and roughly perpendicular to the N-type substrate 102. An insulating material layer 206 is then formed on the first hard mask layer 204, ex. a silicon oxide layer, wherein the insulating material layer 206 fills up each first through hole 202a.

Afterwards, as shown in FIG. 14, the insulating material layer 206 and the first hard mask layer 204 outside each through hole 202a are removed to expose the P-type first epitaxial layer 202, and each first through hole 202a is filled up with an insulating layer 208. Since the insulating material layer 206 and the first hard mask layer 204 in this embodiment are made of the same material, the step of removing the insulating material layer 206 and the first hard mask layer 204 outside each first through hole 202a may be completed by performing a polishing process, but not limited thereto. Next, a P-type second epitaxial layer 210 is formed on the insulating layer 208 and the P-type first epitaxial layer 202. A second hard mask layer 212 is then formed and patterned on the P-type first epitaxial layer 210. Next, the second hard mask layer 212 is used as a mask to form a plurality of second through holes 210a in the P-type second epitaxial layer 210, wherein each second through hole 210a corresponds to each first through hole 202a and exposes the insulating layer 208. Next, a plurality of P-type ions are implanted respectively into the P-type second epitaxial layer 210 at two sides of each second through hole 210a. In this embodiment, the step of implanting P-type ions into the P-type second epitaxial layer 210 may utilize a P-type tilt-angle ion implantation process or a P-type vapor phase doping process, but not limited thereto. A thermal drive-in process is then performed to form two P-type doped channel regions 118 in the P-type second epitaxial layer 210 respectively at two sides of each second through hole 210a, wherein each P-type doped channel region 118 extends from the upper surface of the P-type second epitaxial layer 210 to be in contact with each N-type doped drain region 114. In other embodiments of present invention, it is unnecessary to perform the thermal drive-in process between the step of implanting N-type ions and the step of forming insulating layer, and the N-type doped drain region and the P-type doped channel region may be formed in the same thermal drive-in process.

Next, as shown in FIG. 15, the second hard mask layer 212 is removed to expose the upper surface of the P-type second epitaxial layer 210. A gate structure 120 is then formed in each second through hole 210a, wherein the gate structure 120 includes a gate insulator layer 122 and a gate conductive layer 124, and the gate insulator layer 122 is disposed between the gate conductive layer 124 and the P-type second epitaxial layer 210 and extends onto the P-type second epitaxial layer 210. Then, two N-type doped source regions 126 are formed respectively in the P-type second epitaxial layer 210 at two sides of each second through hole 210a. In this manner, each P-type doped channel region 118 is located between each N-type doped source region 126 and each N-type doped drain region 114. Since the following steps are identical to the ones of the first embodiment, redundant detailed description is herein omitted. The trench type power transistor device 200 of this embodiment is therefore completed. Besides, the number of the first through hole and second through hole in the present invention is not limited to be a plurality. There may be single through hole only.

It is worth noted that the main point of the manufacturing method of this embodiment is to form the N-type doped drain region 114 in the P-type first epitaxial layer 202 by using the tilt-angle ion implantation process or the vapor phase doping process. In this manner, the formed super junction has a better evenness, so as to prevent the defect of the super junction resulting from the voids in the N-type epitaxial layer that are generated by directly filling the N-type epitaxial layer into the through hole 104a.

To summarize, the present invention uses the tilt-angle ion implantation process or the vapor phase doping process to form doped drain region in the epitaxial layer. In this manner, the super junction to be formed has a better evenness, so as to prevent the defect of the super junction resulting from the gaps in the filled epitaxial layer under the condition that another epitaxial layer is filled directly into the through holes of the epitaxial layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a trench type power transistor device with a super junction, comprising:
providing a substrate of a first conductivity type;
forming an epitaxial layer of a second conductivity type different from said first conductivity type on said substrate;
forming at least one through hole penetrating through said epitaxial layer in said epitaxial layer;

forming two doped drain regions of said first conductivity type in said epitaxial layer respectively at both sides of said through hole, wherein said doped drain regions extend from the upper surface of said epitaxial layer to be in contact with said substrate, and said doped drain regions contact said epitaxial layer;

filling an insulating layer into said through hole, wherein the upper surface of said insulating layer is lower than the upper surface of said epitaxial layer;

forming a doped channel region of said second conductivity type respectively in said epitaxial layer at each said side of said through hole on said insulating layer;

forming a gate structure in said through hole on said insulating layer; and forming a doped source region of said first conductivity type respectively on each said doped channel region.

2. The manufacturing method of a trench type power transistor device with a super junction according to claim 1, wherein the manufacturing method between the step of forming said epitaxial layer and the step of forming said through hole further comprises:

forming a first hard mask layer and a second hard mask layer sequentially on said epitaxial layer; and patterning said second hard mask layer and said first hard mask layer to expose said epitaxial layer.

3. The manufacturing method of a trench type power transistor device with a super junction according to claim 2, wherein the manufacturing method between the step of forming said epitaxial layer and the step of forming said first hard mask further comprises:

forming a liner layer on said epitaxial layer; and forming a well region of said second conductivity type in said epitaxial layer.

4. The manufacturing method of a trench type power transistor device with a super junction according to claim 2, wherein the step of forming said insulating layer comprises:

forming an insulating material layer on said second hard mask layer, wherein said insulating material layer fills up said through hole;

performing a polishing process to remove said insulating material layer outside said through hole and said second hard mask layer; and performing an etching process to remove a part of said insulating material layer in said through hole, so as to form said insulating layer.

5. The manufacturing method of a trench type power transistor device with a super junction according to claim 1, wherein the step of forming said doped drain regions comprises a tilt-angle ion implantation process or a vapor phase doping process.

6. The manufacturing method of a trench type power transistor device with a super junction according to claim 1, wherein between the step of forming said insulating layer and the step of forming said doped channel regions, the manufacturing method further comprises:

forming two oxide layers respectively on the two sidewalls of said through hole on said insulating layer, wherein a part of each said doped drain region close to said through hole is transformed to a part of each said oxide layer; and performing a wet etching process to remove said oxide layers.

7. The manufacturing method of a trench type power transistor device with a super junction according to claim 1, wherein the step of forming said doped channel regions comprises a tilt-angle ion implantation process or a vapor phase doping process.

8. The manufacturing method of a trench type power transistor device with a super junction according to claim 3, wherein the manufacturing method between the step of forming said doped channel regions and the step of forming said gate structure further comprises removing said first hard mask layer and said liner layer.

9. A manufacturing method of a trench type power transistor device with a super junction, comprising:

providing a substrate of first conductivity type;

forming a first epitaxial layer of a second conductivity type different from said first conductivity type on said substrate;

forming at least one first through hole extending through said first epitaxial layer in said first epitaxial layer;

forming two doped drain regions of said first conductivity type respectively in said first epitaxial layer at both sides of said first through hole, wherein said doped drain regions extend from the upper surface of said first epitaxial layer to be in contact with said substrate, and said doped drain regions contact said first epitaxial layer;

filling up said first through hole with an insulating layer;

forming a second epitaxial layer of said second conductivity type on said first epitaxial layer and said insulating layer;

forming at least one second through hole in said second epitaxial layer to expose said insulating layer;

forming a gate structure in said second through hole; and forming two doped source regions of said first conductivity type in said second epitaxial layer at both sides of said second through hole.

10. The manufacturing method of a trench type power transistor device with a super junction according to claim 9, wherein the manufacturing method between the step of forming said first epitaxial layer and the step of forming said first through hole further comprises:

forming a hard mask layer on said first epitaxial layer; and patterning said hard mask layer to expose said first epitaxial layer.

11. The manufacturing method of a trench type power transistor device with a super junction according to claim 10, wherein the step of forming said insulating layer comprises:

forming an insulating material layer on said hard mask layer, wherein said insulating material layer fills up said first through hole; and removing said insulating material layer outside said first through hole and said hard mask layer, so as to form said insulating layer in said first through hole.

12. The manufacturing method of a trench type power transistor device with a super junction according to claim 9, wherein the step of forming said doped drain regions comprises a tilt-angle ion implantation process or a vapor phase doping process.

13. The manufacturing method of a trench type power transistor device with a super junction according to claim 9, wherein the manufacturing method between the step of forming said second through hole and the step of forming said gate structure further comprises forming a doped channel region in said second epitaxial layer respectively at each said side of said second through hole.

14. The manufacturing method of a trench type power transistor device with a super junction according to claim 13, wherein the step of forming said doped channel regions comprises a tilt-angle ion implantation process and a vapor phase doping process.

* * * * *